United States Patent [19]

Christopherson

[11] 4,166,982

[45] Sep. 4, 1979

[54] LOGICAL CIRCUIT REFERENCE ELECTRIC LEVEL GENERATING CIRCUITRY

[75] Inventor: Warren A. Christopherson, San Jose, Calif.

[73] Assignee: International Business Machines Corporation, Armonk, N.Y.

[21] Appl. No.: 921,143

[22] Filed: Jun. 30, 1978

[51] Int. Cl.[2] ............................................ H03F 3/45

[52] U.S. Cl. ...................................... 330/259; 330/51; 330/69; 330/85; 330/103; 330/252; 330/297

[58] Field of Search .................. 330/9, 51, 69, 75, 85, 330/103, 252, 259, 260, 297

[56] References Cited

U.S. PATENT DOCUMENTS

| | | | |
|---|---|---|---|
| 3,444,476 | 5/1969 | Leidich | 330/69 |
| 3,721,893 | 3/1973 | Davis | 323/4 |
| 3,868,583 | 2/1975 | Krabbe | 330/259 |
| 4,024,462 | 5/1977 | Highnote et al. | 330/259 |
| 4,105,942 | 8/1978 | Henry | 330/297 X |

OTHER PUBLICATIONS

Ogawa et al., "Stabilized Reference Voltage Source", IBM Technical Disclosure Bulletin, vol. 13, No. 9, Feb. 1971, p. 2689.

Mitchell, "Monolithic Current Source"; IBM TDB; vol. 13, No. 12, May 1971, p. 3720.

Azziz, "Current Source Scaling Circuit"; IBM-TDB; vol. 19, No. 5, Oct. 1976, pp. 1709–1710.

Chin, "On-Chip Voltage Regulator"; IBM-TDB; vol. 19, No. 6, Nov. 1976, pp. 2078–2079.

*Primary Examiner*—Lawrence J. Dahl
*Attorney, Agent, or Firm*—George E. Roush

[57] ABSTRACT

The circuitry is arranged to develop a highly accurate and stable reference electric level voltage and/or current for distribution to a plurality of logical circuits on a semiconductor chip having of the order of a thousand such circuits thereon. An input reference voltage is developed by a source reference circuit and applied to an operational amplifier circuit having "evener" circuitry for substantially equalizing the currents in the input transistors. This evener circuitry is essentially an operational amplifier within an op-amp. It monitors and adjusts feedback voltages. The operational amplifier and evener circuitry drives a reference voltage distribution grid laid out over the semiconductor chip.

14 Claims, 5 Drawing Figures

LOGICAL CIRCUIT REFERENCE ELECTRIC LEVEL GENERATING CIRCUITRY

The invention is related to a copending U.S. patent application Ser. No. 921,142 filed on the 30th day of June 1978 for "Integrated Semiconductor Current Driver Circuitry".

FIELD OF INVENTION

The invention relates to semiconductor voltage and current regulating circuitry, and it particularly pertains to such circuitry for integrated semiconductor devices of low current consumption requiring close supply voltage regulation.

BACKGROUND

Semiconductor current and voltage regulating circuit arrangements are well known. As time passes, the need for lower power, faster, closer tolerance and lower cost circuitry arises. Others have offered particular solutions to particular problems in this problem area. Examples of the regulator circuitry of the prior art that meet one or more of these criteria are to be found in the following U.S. patents:

| | | | |
|---|---|---|---|
| 3,444,476 | 5/1969 | Leidich | 330/69 |
| 3,721,893 | 3/1973 | Davis | 323/4 |
| 3,868,583 | 2/1975 | Krabbe | 330/259 |
| 4,024,462 | 5/1977 | Highnote et al | 330/259 |

And in the technical literature:

S. Ogawa, R. I. Spadavecchia and J. R. Struk; "STABILIZED REFERENCE VOLTAGE SOURCE"; IBM Technical Disclosure Bulletin; Vol. 13, No. 9; February 1971; p. 2689.

J. W. Mitchell; "Monolithic Current Source"; IBM TDB; Vol. 13, No. 12; May 1971, p. 3720;

D. Azziz; "Current-Source Scaling Circuit"; IBM TDB; Vol. 19, No. 5; October 1976, pp. 1709–10;

W. Chin; "ON-CHIP VOLTAGE REGULATOR"; IBM TDB; Vol. 19, No. 6; November 1976; pp. 2078–9.

These prior art references show circuitry having components in common with that of the invention for performing one or more of the functions that are performed by the circuitry according to the invention, but the components thereof are interconnected in different configurations and operate in different manner than the circuitry according to the invention.

The patent to Leidich shows a two-stage direct-coupled differential amplifier circuit having a feed forward (or feed back depending upon the viewpoint) path between a common load resistor for the first stage of the amplifier and for an emitter current regulating transistor in the last stage of the amplifier. This circuit arrangement corrects non-differentially and primarily for power supply variations, but the concept is probably applicable to the correction for other variations.

The patent to Davis is directed to a reference current generating circuit of the type wherein a compensating shunt drain is adjusted whereby the current flow through the current source is exactly equal to that through the load. This arrangement provides compensation without any loss due to any compensating feed back network.

The patent to Krabbe discloses balanced feedback paths for a differential amplifying circuit whereby four current sources are simultaneously and complimentary controlled for minimizing unbalance.

The patent to Highnote et al discloses a differential amplifier circuit having transistors connected in the Darlington configuration as the main amplifying devices and having precisely matched or adjusted control resistors arranged within the Darlington circuit configurations for maintaining a substantially zero direct offset current condition.

The publication to Ogawa et al discloses a stabilized reference voltage generating circuit arrangement having some similarities to the circuitry according to the invention. Here two different feedback paths are arranged for compensation but two additional current sources are required.

The arrangement of Mitchell comprises a feedback path through both sides of a single differential amplifying circuit for comparing and tracking voltages at the bases of the two transistors. If there is any difference in potential between the two voltages, feedback connection changes the base current flowing through the current transistor connected to the output emitter follower thereby bringing the voltages back into equality.

The circuits shown in the publications of Azziz and of Chin show other minor circuit configurations of the type with which the invention is concerned.

None of these references however disclose the evener circuitry according to the invention for the base current compensating circuit for the input differential amplifying circuit according to the invention hereinafter to be described.

SUMMARY

The objects of the invention indirectly referred to hereinbefore and those that will appear as the specification progresses obtain in novel voltage regulating circuitry comprising three, or four, amplifying circuits interconnected with negative feedback circuitry and having simple matching provisions.

Basically this circuitry comprises a differential amplifying circuit to one input terminal of which a primary reference potential is applied. This primary reference potential may be a tap on a voltage divider connected across the energizing potential supply or it may be the output of another similar voltage regulating circuit according to the invention. One of the balanced output terminals of this differential amplifying circuit is applied to the input terminal of a repeating circuit arranged for delivering the desired reference voltage at the output terminal thereof. This output voltage is delivered to a plurality of utilization circuits laid down on the same semiconductor chip with the regulating circuitry. Regulation to the first order is effected by a inverse feedback connection between the output and the other input of the differential amplifying circuit. A second order of regulation is provided by a differential amplifier circuit having a pair of input terminals individually connected to the balanced output terminals of the differential amplifying circuit and having single ended output. The output of this amplifier circuit is fed back by individual electric conducting elements which, preferrably, are resistors to both of the input terminals of the current-flow-evening differential amplifier circuit. This connetion also feeds the output of the current-flow-evening differential amplifier to the input of the repeating circuit through the common connections as described above.

In one embodiment of the invention an inverting circuit is interposed in the feedback lead for improving the regulation of the circuitry. Where the circuitry is intended for voltage level shifts of multiples of the $V_{BE}$ voltage drops of the transistors and diodes on the semiconductor chip, the desired offset is obtained by interposing a diode in the emitter bias leads. Alternatively a transistor is interposed in the emitter bias lead and improved regulation is had by applying the output reference voltage to the base electrode of this transistor. Also the output of the differential amplifier circuit of the current flow evening circuitry is coupled to the load resistors for the differential amplifying circuits by means of an emitter follower transistor.

The repeating circuit preferrably comprises an input emitter follower transistor and at least one output emitter follower transistor although it is contemplated that a multiple of such output emitter follower transistors be used. Each such output transistor supplying a number of utilization circuits on the semiconductor chip. Preferrably this loading is distributed in a manner minimizing variation in output voltage.

DRAWING

In order that all of the practical advantages of the invention obtain in practice, preferred and best mode embodiments thereof, given by way of example only, are described in detail hereinafter with the reference to the accompanying drawing, forming a part of the specification, and in which.

Figure 2A:
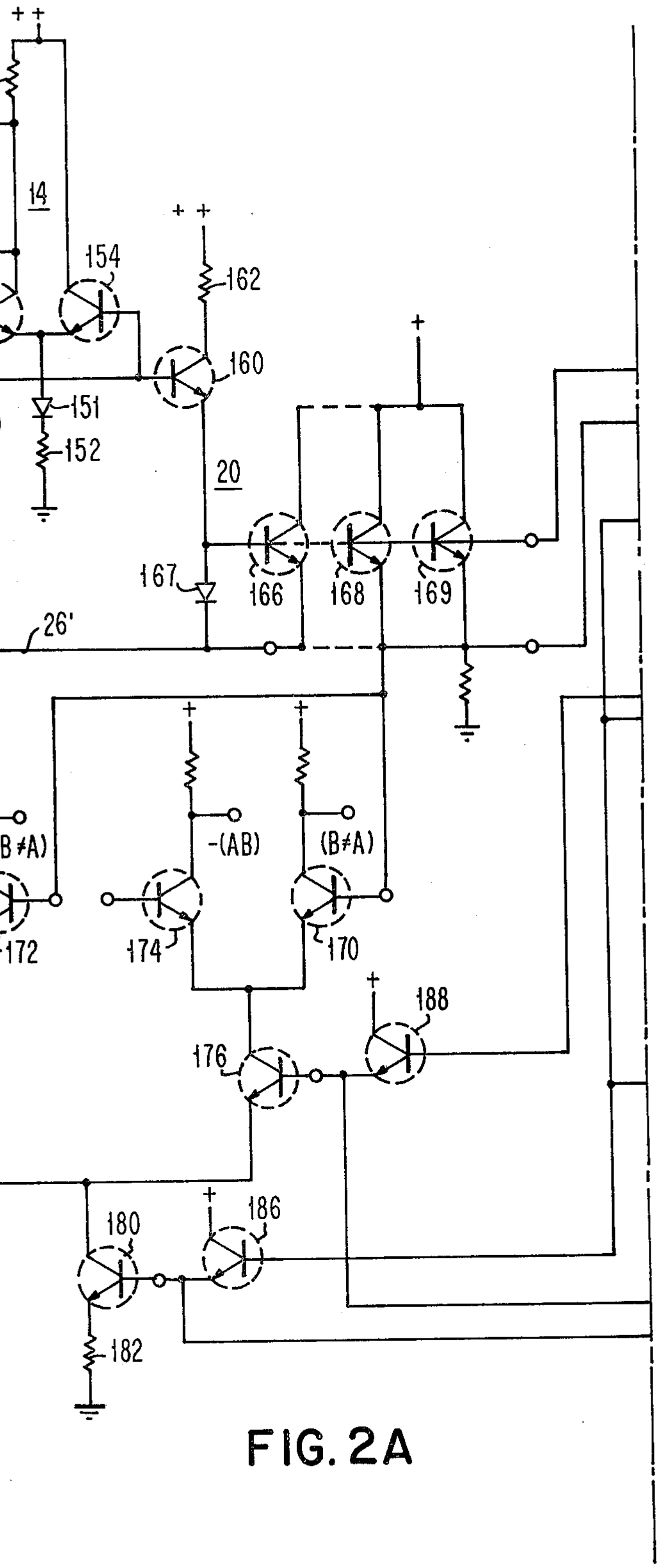
FIG. 2A is a schematic diagram of one embodiment of voltage regulating circuitry according to the invention along with a typical load circuit.
Figure 3:
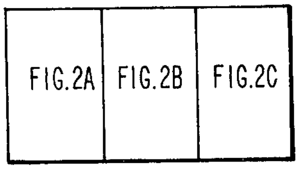
Figure 2B:
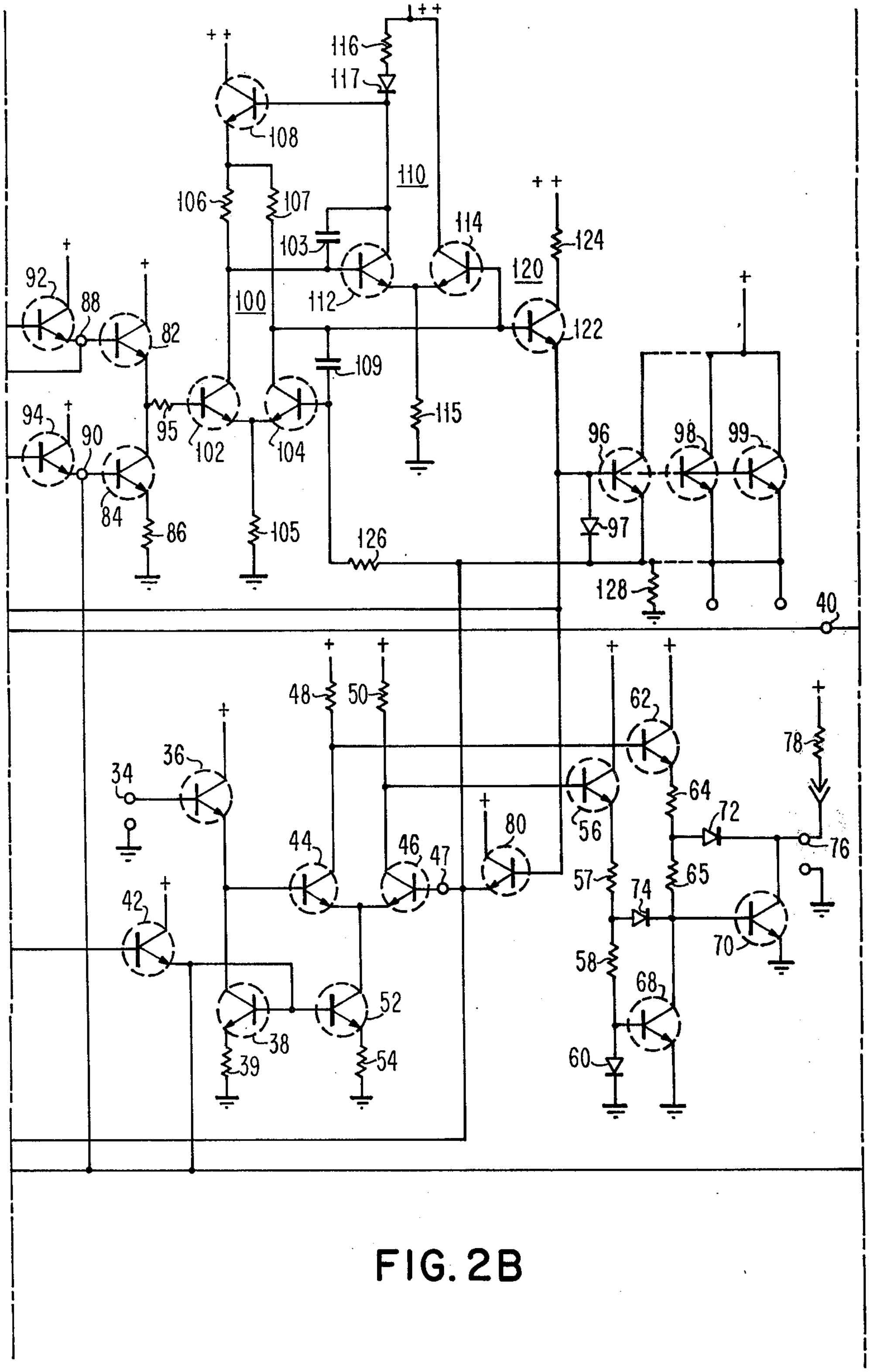
FIG. 2B is a schematic diagram of another embodiment of voltage regulating circuitry according to the invention along with another typical load circuit.
Figure 2C:
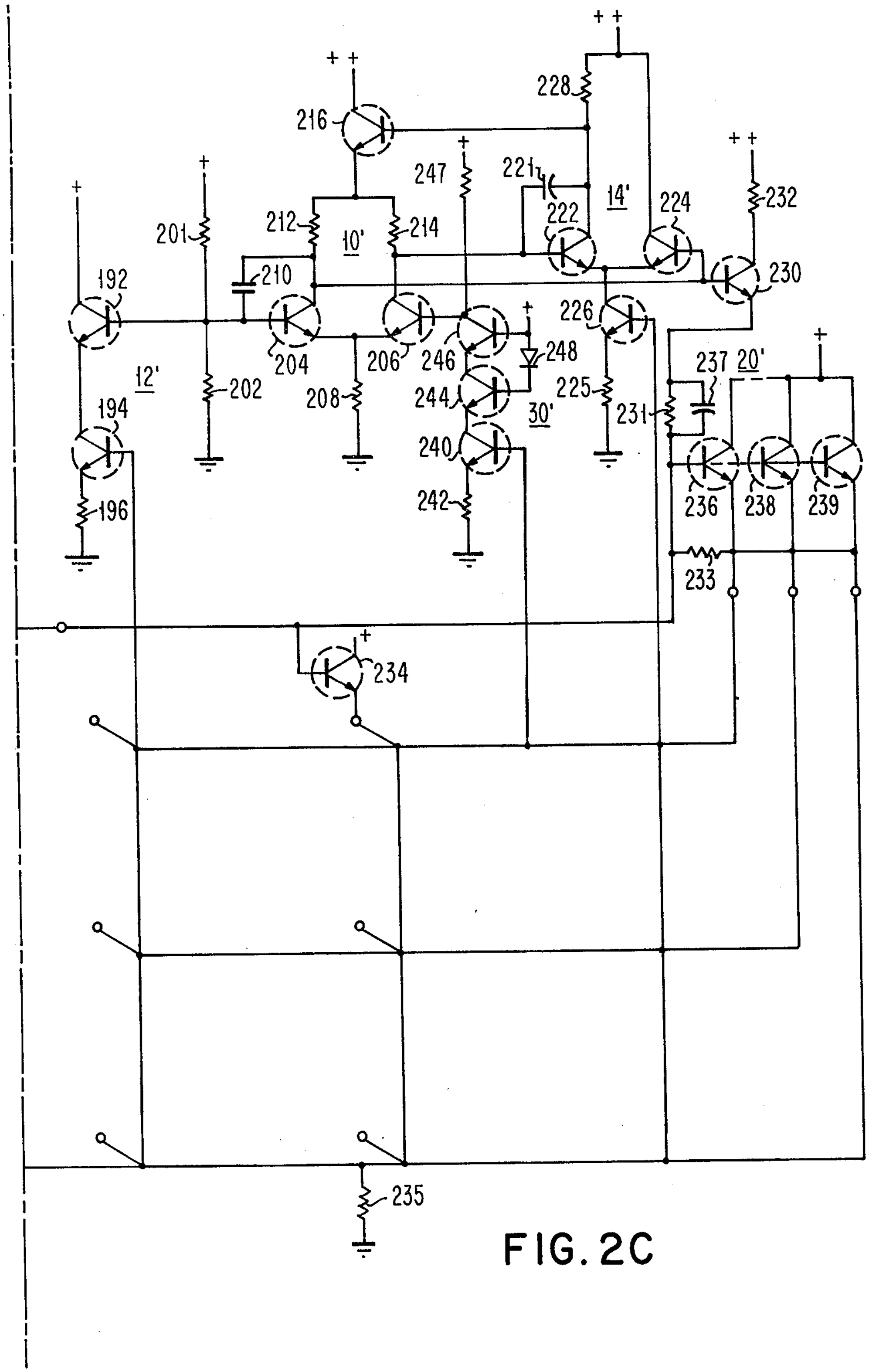

FIG. 2C is a schematic diagram of a further embodiment of the voltage regulating circuitry according to the invention along with a simplified example of an equipotential grid layout; and FIG. 3 is a block diagram showing how the circuits shown in schematic diagrams of FIGS. 2A, 2B and 2C are interconnected for use on a single semiconductor chip in one exemplary application of voltage regulating circuitry according to the invention.

DESCRIPTION

Figure 1:
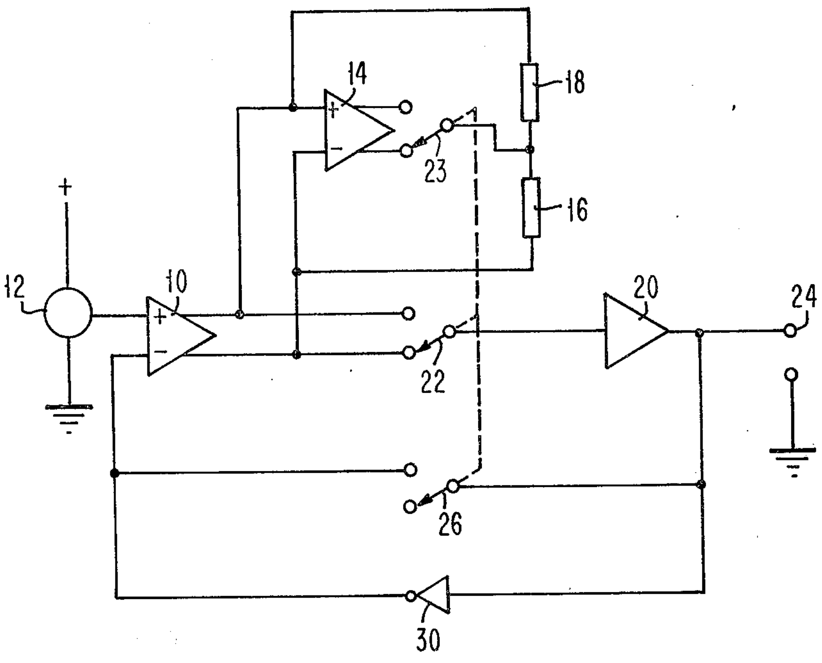
FIG. 1 is a functional diagram of voltage regulating circuitry according to the invention.

A functional diagram of circuitry for delivering a closely regulated voltage according to the invention is shown in FIG. 1. A first differential amplifying circuit 10 has one input terminal thereof connected to a source 12 of reference voltage connected between a point of positive potential and a point of fixed reference potential shown here as ground. Balanced output of the differential amplifying circuit 10 is applied to balanced input terminals of a second differential amplifying circuit 14 having the output terminal thereof connected to the junctions between elements 16 and 18 of a voltage dividing arrangement connected across the input terminals of the balanced amplifying circuit 14. An unbalanced amplifying circuit 20 has the input terminal thereof connected, as shown by way of a switch 22 for example, to one of the output terminals of the first differential amplifying circuit 10 for delivering a regulated voltage at the output terminals 24, which voltage is applied in the normal or erect relationship through a switch 26, when closed, to the other input terminal of the first differential amplifying circuit 10. In some embodiments of the circuit arrangements according to the invention the output potential of the amplifying circuit 20 is applied to the input circuit of the first amplifying circuit 10 through an inverting circuit 30, with the switch 26 open of course. Also the switch 22 and the switch 23, connected to the junction point of the voltage divider elements 16 and 18, must be shifted for connection to the other output terminal of the amplifier circuit 14 for consistency regarding polarity. These circuit arrangements will be shown hereinafter to apply to the more detailed schematic diagrams of different embodiments of this circuitry according to the invention as shown in FIGS. 2A, 2B and 2C. In practice, these circuits are frequently laid down on a single semiconductor chip for regulating the voltage applied to other, on the order of 1,000, load circuits on that chip.

It is an advantage of the basic voltage regulating circuitry according to the invention that one or more of the embodiments thereof may be used to supply regulated reference voltage to another embodiment of the invention as will be described. FIG. 3 is a key to the manner in which these voltage regulating circuits are so interconnected for this purpose.

A typical load circuit of the type requiring the degree of regulation afforded by the regulative circuitry according to the invention is shown in FIG. 2B, which depicts a transistor driver circuit. A bistatic signal, representative of two binary logical circuit electric levels is applied at input terminals 34. The terminals 34 lead to the base electrode of a transistor 36 of an input emitter follower circuit having an additional transistor 38 and a resistor 39 connected in the emitter circuit. Fixed reference potential obtained from a source according to the invention appears at an input terminal 40 and is applied to the base electrode of an emitter follower transistor 42. The emitter electrode of the latter is connected to the base electrode of the transistor 38. The junction of the emitter electrode of the transistor 36 and the collector electrode of the transistor 38 is connected to the base electrode of a transistor 44 forming part of a current switch circuit having another transistor 46, the emitter electrode of which is connected to the emitter electrode of the transistor 44. Resistors 48 and 50 form the load resistors for the transistors 44 and 46 respectively. Regulated voltage, from preferably other source circuitry according to the invention, is applied to the base electrode of the transistor 46. The emitter electrodes are connected in common to the collector electrode of another transistor 52 having a resistor 54 connected between the emitter electrode and to a source of fixed reference potential shown here as ground. The same reference voltage applied to the base electrode of the transistor 38 is also applied to the base electrode of the transistor 52.

The output from the transistor 46 of the current switch is applied to the base electrode of a transistor 56 forming a part of an in-phase emitter follower circuit having a resistor 57, resistor 58, and diode 60 connected in series between the emitter electrode of the transistor 56 and the point of fixed reference potential. The output of the transistor 44 is connected to the base electrode of another transistor 62 which is a part of an out-of-phase emitter follower circuit network of similar configuration. The emitter electrode of the transistor 62 is connected to a resistor 64, a resistor 65, and the collector-emitter circuit of another transistor 68 and thence to the point of fixed reference potential.

The emitter follower circuits are connected to drive a signal output transistor 70 in the output circuit. A diode 72 is connected between the junction of resistors 64 and 65 and the collector electrode of the signal output transistor 70, while another diode 74 is connected between the junction of resistors 57 and 58 and the base of the signal output transistor 70. Output terminals 76 are connected across the collector and emitter electrode of the signal output transistor 70 with the connection to the emitter electrode preferably being connected to a point of fixed reference potential as shown. Energizing potential for the signal output transistor 70 is obtained externally of the driver circuit and applied through a load resistor 78 that is a part of the external circuit which is otherwise connected to the output terminal 76. This load circuit is described in greater detail in the above-mentioned copending U.S. patent application Ser. No. 921,142.

REFERENCE LEVEL GENERATING CIRCUITRY

As mentioned hereinbefore the switching circuit transistor 46 has the base electrode thereof connected to a source of fixed reference potential applied at the terminal 47 which is shown connected to the emitter electrode of a regulated reference level output transistor 80 arranged in the reference potential generating circuitry according to the invention which is laid down on the same semiconductor chip. A pair of transistors 82 and 84 have the collector-emitter circuits connected in series with a resistor 86 between the point of positive energizing potential and the point of fixed ground reference potential. The base electrodes of the transistors 82 and 84 are supplied with regulated reference potential generated in accordance with the invention as will be described more fully hereinafter and supplied at input terminals 88 and 90 which are respectively connected to the emitter electrodes of regulated voltage output transistors 92 and 94. The latter transistors function in substantially the same manner as transistor 80 previously mentioned and as transistors 96, 98 and 99, which are arranged in a regulator operational amplifier feedback path, as will be described in greater detail hereinafter. The junction between the emitter electrode of the transistor 82 and the collector electrode of the transistor 84 is connected by way of a resistor 95 to the base electrode of a transistor 102 of a first differential amplifying circuit 100 having another and complementary input transistor 104 having a base electrode connected by way of a resistor 126 to the emitter electrode of the transistor 96. A capacitor 109 is connected between the base electrode of the transistor 104 and the collector electrode thereof. The collector-emitter circuits of the transistors 102 and 104 are connected by way of resistors 106 and 107 to the emitter electrode of a transistor 108.

A second differential amplifying circuit 110 has a pair of input transistors 112 and 114 having the base electrodes thereof individually connected to the collector electrodes of the transistors 102 and 104 of the first amplifying circuit 100 respectively. The base electrode of the transistor 112 is connected to the collector electrode thereof by a capacitor 103. The emitter electrodes of both transistors 112, 114 are connected to reference potential ground through a resistor 115. The collector electrode of the first transistor 112 is connected to a second point of positive potential higher than the first point, by means of series connected resistor 116 and a diode 117 while the collector electrode of the other transistor 114 is connected directly to the same point of positive potential. The collector electrode of the transistor 110 is connected to the emitter-follower transistor 108. The collector electrode of the transistor 108 is connected to the second and higher point of positive potential.

A third amplifying circuit 120 comprises a single transistor 122 having the base electrode connected to the collector electrode of the transistor 104, and having the collector electrode connected to the second point of positive potential by way of a resistor 124. The emitter electrode of the transistor 122 is connected in common to the base electrodes of the regulated voltage output transistors 80, 96, 98 and 99. A resistor 126, equal in value to the resistor 95, is interposed in the feedback loop between the base electrode of the transistor 104 and the emitter electrodes of the transistors 96, 98, 99 among other common connected transistors all of which are connected to reference potential ground by way of a resistor 128. A diode 97 is arranged to bias the transistors to turn off. Other connections to the regulated voltage output transistors 80, 96, 98, 99 and 188 will be discussed in detail hereinafter.

MODIFIED EMBODIMENT

Another embodiment of voltage regulating circuitry according to the invention is shown in FIG. 2A. The reference voltage source 12 in this instance is comprised by two resistors 131, 132, connected in series between a point of positive energizing potential and the point of fixed reference potential shown here as ground. The reference potential at the junction of the two resistors 131, 132 is applied, by way of a resistor 133 to the base electrode of a transistor 134 of the first amplifying circuit 10 having a complimentary input transistor 136. Emitter electrodes of the latter transistors are connected to ground reference potential by way of a resistor 138. Balanced output from the amplifying circuit 10 is obtained across load resistors 142 and 144 respectively to which higher positive energizing potential is applied by way of the collector-emitter circuit of a transistor 146 having the base electrode connected to the collector electrode of another input transistor 148 of the second amplifying circuit 14. A capacitor 140 connected between the base electrode of the transistor 136 and the collector electrode. A capacitor 150 is connected between the base electrode of the transistor 148 and the collector electrode. The emitter electrode of the transistor 148 is connected to ground reference potential by means of a diode 151 and a resistor 152 and also to the emitter electrode of a complimentary input transistor 154. The collector electrode of the latter transistor is connected directly to the second source of positive energizing potential while the collector electrode of the other input transistor 148 is connected to the same energizing potential through a load resistor 156. The base electrode of the transistor 154 is connected to the collector electrode of the transistor 136 of the first amplifying circuit 10 which is also connected to the base electrode of a transistor 160 of the third amplifying circuit 20. Positive energizing potential is applied through a resistor 162 to the collector electrode of the amplifying transistor 160. The output of the latter transistor is applied to the base electrodes of a number of regulated voltage output transistors, of which only transistors 166, 168 and 169 are shown here immediately. The latter transistors are effectively connected in emitter follower circuit configuration having like electrodes substantially connected in common, with individual load elements connected to the commonly connected emitter electrodes. The output transistors 166, 168 and 169 are thus incorporated in a negative feedback path of the amplifying circuit 10 from the collector to base of the transistor 136; the feedback loop includes the transistor 160 and the resistor 165. A diode 167 provides turn off bias for the transistors 166, 168 and 169. The resistor 165 must be substantially the same value as the resistor 133. It is contemplated that up to the order of a thousand logical circuit loads will be accommodated, in which case there will be a number of these output emitter follower circuit output transistors dispersed about the semiconductor chip quite close to the point at which the regulated voltage level is required.

The emitter electrodes of the output emitter follower transistors 166, 168 and 169 are connected in common to the base electrodes of two transistors 170, 172 which are components of not entirely conventional logical circuitry. The emitter electrode of the transistor 170 along with that of another transistor 174 is connected to the collector electrode of a subcircuit transistor 176. In turn the emitter electrode of the transistor 176 along with that of another complementary transistor 178 is connected in the collector emitter circuit of a transistor 180 and a emitter resistor 182 completes the circuit to the point of fixed reference potential shown here as ground. Another transistor 184 forms a complement of the transistor 172 for circuitry similar to that in which the previously mentioned transistors 170 and 174 are connected to complete the logical circuit as shown here. This logical circuitry is quite typical of the load circuitry to be supplied by the voltage regulating circuit according to the invention. The upper logical regulated voltage level that appears at the emitter electrode of the transistor 168 is applied to the base electrode of the transistor 170. The lower level limit of logical regulated voltage level is applied to the base electrode of the transistor 176 by way of a emitter follower transistor 188 to the base of which the output of the transistor 122 is applied in common with the regulated voltage output transistors 80, 96, 98 and 99 previously mentioned. Regulated voltage is applied to the base electrode of the transistor 180 by way of an emitter follower transistor 186 having the emitter electrode fixed in potential because the base of the transistor 186 is incorporated in a negative feedback loop in a further embodiment of voltage regulating circuitry according to the invention to be described more fully hereinafter.

FURTHER EMBODIMENT

A third embodiment of voltage regulating circuitry according to the invention is shown in FIG. 2C. Here the reference voltage generating circuit 12 comprises a pair of resistors 201 and 202 connected in series between a point of positive energizing potential and a point of fixed reference potential shown here as ground. The base electrode of the transistor 192 is connected to the junction of the resistors 201 and 202 so that the base current slightly modifies the reference potential better to track the other regulator potentials with respect to variations in temperature and process variables. The reference voltage at the junction point is connected to the base electrode of one input transistor 204 of a first differential amplifying circuit 10 having another complimentary input transistor 206. The emitter electrodes of the two transistors are connected to ground through a resistor 208. A capacitor 210 is connected between the base electrode and the collector electrode of the first transistor 204. Load resistors 212 and 214 are individually connected to the collector electrodes of the transistors 204 and 206 and in common to the emitter collector circuit of a transistor 216 to the second point of positive potential. A pair of transistors 222 and 224 forming the input transistors to a second differential amplifying circuit 14 have the base electrodes individually connected to the respective collector electrodes of the transistors 206 and 204. The emitter electrodes of the transistors 222 and 224 are connected in common through the collector-to-emitter circuit of a transistor 226 and a resistor 225 to the point of fixed reference potential shown as ground. The collector electrode of the transistor 222 is connected to the base electrode of the transistor 216 and to a load resistor 228 which is connected to the second point of positive potential, which is potential is also connected directly to the collector electrode of the transistor 224. A transistor 230 has a base electrode connected to the collector electrode of the transistor 204 of the amplifying circuit 10 and the collector electrode is connected through a load resistor 232 to the second point of positive energizing potential. The emitter electrode is connected in common through parallel connected resistor 231 and capacitor 237 to the base electrodes of a number of regulated voltage output transistors, of which only transistors 234, 236, 238 and 239 are shown in this figure. The collector electrodes of the latter transistors are all connected to the point of positive energizing potential, and a common load resistor 235 is connected between the emitter electrodes and the point of fixed reference potential. The resistor 233 is connected between the common connected base electrodes and the common connected emitter electrodes of the output transistors 234, 236, 238 and 239, among others, to provide base current bias. The emitter electrode of the reference voltage output transistor 234 particularly, although it is connected in common to the emitter electrodes of 8 other output transistors, is connected to the base electrode of the transistor 240 forming the input transistor of an inverting circuit 30'. The emitter electrode of the transistor 240 is connected to ground through a resistor 242. The inverter circuit 30 comprises two other transistors 244, 246, and a diode 248, the latter of which is connected between the base electrodes of the transistors 244 and 246. The anode electrode of the diode 248 is connected to the point of positive energizing potential, while the collector electrode of the transistor 246 is connected to a load resistor 247, to the first point of positive potential and to the base electrode of the transistor 206 in the amplifying circuit 10'. The emitter electrode of the transistor 244 is connected directly to the collector electrode of the input transistor 240 completing the circuit of the inverting circuit. This circuit arrangement is used in the overall arrangement as shown for generating the regulated reference source voltage $V_{RS}$. The circuit arrangement shown in FIG. 2A is used in the overall arrangement for generating a upper level logical regulated output voltage $V_{RU}$, while the lower level regulated output voltage $V_{RL}$ is generated by the circuit shown in FIG. 2B.

The schematic diagrams have been drawn in conventional fashion affording convenience in understanding the operation of the circuitry. The regulated voltage output transistors for the two load circuits illustrated have been shown as close to the circuit component for which the regulated output voltage is supplied, while other regulated voltage output transistors are shown together for conveying the impression that a number of such output transistors are connected in parallel. In one installation 9 output emitter follower transistors serve about a thousand load circuits. Such parallel output transistors are electrically connected in the feedback paths of their respective regulator circuits. For example, lower level $V_{RL}$ output transistors 80, and 188 are shown close to the point of application while transistors 96, 98 and 99 are shown close to the amplifier transistor 122 by which they are driven. The $V_{RU}$ output transistors 166, 168 and 169 are shown close to the transistor 160 which drives them and transistor 92 is shown located close to the circuit components to which the regulated voltages applied. Likewise source voltage, $V_{RS}$, voltage output transistors 42, 94 186, and 234 are shown as located near the respective loads, while other output transistors 236, 238 and 239 are shown adjacent the transistor 230 which drives them. It should be noted that for each catagory of voltage output transistors, all of the base electrodes are connected in common, all of the collector electrodes are connected in common and all of the emitter electrodes are connected in common. This is true no matter where the regulated voltage output transistor is located on the semiconductor chip. Thus a lot of intended equi-potential conductors are laid down on the chip in this arrangement. However, there is actually a voltage drop in each of the conductors conveying the regulated output voltage. Because the common emitter follower transistors are in the feedback loop, changes in the common $V_{BE}$ drop due to temperature and load changes cause relatively little change in the common output voltage. In some applications of the regulating voltage circuitry according to the invention, the difference between the upper and lower limits of logical voltage levels is of the order of two thirds of the base-to-emitter voltage of the associated transistors. In such an arrangement voltage drops along the conductors may not always be considered negligible. Therefore the semiconductor chip, preferably, is gridded as suggested in FIG. 2C between the emitter electrodes of the regulator voltage output transistors 234, 236, 238, 239, 186, 94 and 42. The regulated voltage output transistors have the base electrodes connected by conventional circuit wiring as the base currents are low and only negligible voltage drops are encountered. The emitter electrodes are actually connected together in a gridded arrangement as suggested in FIG. 2C with the individual loads connected to the individual emitter electrodes of the nearest output transistor over very short leads of the grid conductors because the current is relatively large at these locations. The connections of the output transistors are usually connected to the grid conductors at intersections thereof in the interest of greater conductivity while the load circuits are connected at any point along a conductor at the nearest point. With this construction the logical voltage and/or current level to the logic circuitry is substantially uniform throughout the semiconductor chip.

OPERATION

The operation of the overall circuitry according to the invention as thus far disclosed will be described in terms of a practical application, of which a microprocessor is a good example for bringing out the salient features of the novel circuitry. Such an application frequently uses a form of current switch logic requiring a very accurate control of the current in each logic circuit. As stated hereinbefore, it is quite common that 1,000 or more such logic circuits, together with the current sources, are laid down on a single silicon chip. The circuitry according to the invention develops a reference voltage which is distributed to current sources in each logic circuit for controlling the magnitude of the currents of the logical load circuitry; other reference voltages distributed to each logical circuit enable the switching of the logical circuit current within each logical circuit.

Referring again to FIG. 1 with the switch 22 connected to the inverted output terminal of the amplifying circuit 10 and the switch 26 open, the basis for operation of the embodiment of the current-source reference voltage generator shown in FIG. 2c will be noted. An input reference voltage obtained from the circuit 12 is applied to the erect (+) input terminal of the differential amplifier 10. The inverted (−) input terminal of the differential amplifier circuit 10 is supplied with the output from the inverting circuit 30 to the input of which the source reference voltage, $V_{RS}$, is applied. The inverting circuit 30 represents a simulated or dummy logic circuit having a voltage gain of −0.5. The inverted output terminal of the differential amplifying circuit 10 is applied to the two stage emitter follower circuit 20, powerful enough to drive the current-source-reference-level voltage, $V_{RS}$, for the entire logical circuitry on the chip which contains about 1,000 circuits and/or current sources. The feedback action clamps the inverted output of the differential amplifying circuit 10 at a level determined by the components in the emitter follower 20 and in the inverting circuit 30. The direct output terminal of the differential amplifying circuit 10 is connected to the direct input terminal of the evening differential amplifier circuit 14, while the inverted input terminal of the latter is connected to the inverted output terminal of the amplifying circuit 10 and to one terminal of a feedback element 16 having the other terminal connected to the inverted output terminal of the amplifier circuit 14. Another feedback element 18 is connected between the inverted output terminal of the amplifier circuit 14 and the erect input terminal thereof. This feedback arrangement is designed so that the output terminals of the amplifying circuit 10 and therefore the input terminals of the amplifier circuit 14 are held to the same value within about ±45 millivolts. The feedback elements 16 and 18 preferrably are simple resistance elements. The total voltage drop across the resistance elements 16 and 18 is determined by the current source within the amplifying circuit 10 and is about 1 volt. Thus the voltages and therefore the currents in the resistance elements 16 and 18 are equal within ±4.5%. The current flowing in the resistance elements 16 and 18 are essentially the load currents of the amplifying circuit 10. The input voltage difference to the amplifying circuit 10 is a logarithmic function of the output current ratio of the currents through the resistors 16 and 18. If these currents are within ±4.5% then the inverted amplifying circuit 10 input to substantially, within a few millivolts, will match the input to the erect input terminals of the amplifying circuit 10, which input is the voltage from the reference voltage circuit 12.

Since the voltage at the inverted input terminal of the input amplifying circuit 10 is that of the output of the inverting logical circuit 30, the reference level $V_{RS}$ is automatically adjusted to maintain the logical circuit output voltage constant and equal to that of the reference voltage from the generating circuit 12.

The clamping of the input to the emitter follower circuit 20 stems from the feedback by way of the inverting circuit 30 around the input amplifying circuit 10. The small signal devitions of current and voltage illustrate the clamping at the input of the emitter follower circuit 20. For example, if the output of the evener amplifier circuit 14 increases 1 volt, the inverted input voltage increases 1/9 volt and the inverted input to the differential amplifying circuit 10 decreases by 1/18 volt because the voltage gain of the inverting circuit 30 equals $-0.5(-\frac{1}{9})$. Now the current flowing in the resistance element 16 is increased by 4/9 milliampere due to a transconductance of 0.008 mho of the amplifying circuit 10. The current in the resistor 18 is simultaneously decreased by 4/9 milliampere because the sum of the current controlled by the differential amplifying circuit 10, which are the currents flowing in the resistors 16 and 18, must be substantially constant, being controlled by an emitter resistor element in the amplifying circuit 10. The resistance element 16 and 18 preferably are given values of 2 kilohms each and therefore the change in the voltage drop across the resistance element 16 is 4/9×2K or 8/9 volts. The increase in the output voltage of the amplifier circuit 14 of one volt less the increase the voltage drop in across the resistor 16 of 8/9 volt adds up to a net change of only 1/9 volt at the input to the amplifier circuit 20. Thus the inverter output voltage of the amplifying circuit 10 and the input voltage of the emitter follower circuit 20 is clamped to 1/9 volt for a 1 volt shift in the output of the emitter follower circuit 20.

The two output terminals of the differential amplifier circuit 14 must exhibit opposite current changes therefore the voltage at the direct output terminal will increase to 1 8/9 volts. Thus the originally assumed 1 volt change in the output of differential amplifier circuit 14 has a relatively large effect on the erect output of the differential amplifying circuit 10 and a small effect on the inverted output whereby the negative feedback from the amplifier circuit 14 can effectively bring the erect and inverted output voltages from the amplifying circuit 10 to substantially equality without substantially changing the inverted output voltage of the amplifying circuit 10. There is relatively little interaction between the two feedback systems.

Referring specifically to FIG. 2C, the voltage divider comprising resistors 201 and 202 deliver a voltage for application to the base electrode of the transistor 204 which is 0.265 volts below the energizing potential level (indicated by a single + symbol) which preferably is 3.0 volts. The desired logic circuit signal swing is 0.53 volts (twice 0.265 volts). The transistors 192 and 194 simulate one logic circuit load. The purpose of this load is two fold: first, it causes the reference to track the $V_{RU}$ offset inherent in the $V_{RU}$ reference generating circuit; second, it effects a wider voltage swing in the logic circuits on low beta semiconductor chips where it can be tolerated and thereby improve the "worst case" operation. The output impedance of the generating circuit 12 is 1,000 ohms which is the same as the simulated logic circuit comprising the inverter circuit 30. Thus the loading of the reference generating circuit 12 by the amplifying circuit 10 at the base electrode of the transistor 204 is compensated by the loading of the resistor 247 by the base electrode of the transistor 206. The latter transistors have generously sized emitters to achieve good $V_{BE}$ tracking within ±5 millivolts. The resistor 208 keeps the total emitter current at about 1 milliampere and the capacitors 210 and 237 prevent oscillation in the feedback loop through the amplifiers 20 and 30 by insuring that the feedback open loop gain magnitude is below unity at frequencies where the phase shift is 180 degrees or greater. The differential amplifying circuit 14' comprises one collector loaded transistor 222 and a low impedance emitter follower transistor 224. The total current is established by the emitter bias supplying the transistor 226 and the resistor 225 at 0.50 milliampere. The current division between the transistors 222 and 224 ranges between 1:6 and 3:1 over the range of all operating conditions and variations in parameters. The main variation encountered is in the energizing potential supply of about 8.5 volts as indicated by the double positive (++) symbol which varies within ±0.85 volts. The voltage drops and current ratios with respect to resistors 212 and 214 match within a range of 0.964–1.045. This corresponds to an offset of less than ±1.4 millivolts due to the difference in base-to-emitter voltages of the transistors 204 and 206. The capacitor 221 reduces the loop voltage gain in the feedback path of the amplifier circuit 14 through the resistors 212 and 214 to less than unity at higher frequencies where the phase shift is more than 180 degrees, to prevent oscillation.

The amplifier 20' is a two-stage emitter follower circuit comprising the transistor 230 and the output transistors of which 234, 236, 238, . . . 239 only as shown in this figure for powering and distributing the regulated source voltage, $V_{RS}$, output to the 1,000 or so logical circuits on the semiconductor chip. The voltage divider comprising the resistors 231 and 233 causes an additional $V_{BE}$ drop between the emitter of the transistor 230 and the base of the parallel connected transistors 236, 238 and so on. This is needed to keep the base electrode of the transistor 230 high enough so that the transistor 204 of the amplifying circuit 10 does not saturate. The resistance of the resistor 231 is also needed to prevent latching of the inverted output of the amplifying circuit 10 to the positive energizing potential through the base-emitter junction of the transistor 230 and the base collector junctions of the parallel transistors 236 and the like. Resistors in the collector leads of the emitter followers 234 236, 238 and 239 can be interposed to limit the emitter currents in these output transistors to a safe level during powering up when the capacitance in the load supplied by the regulated source voltage, $V_{CS}$, is charging. As stated previously, the emitter follower transistors 234, 236 and so on are located on the grid about the semiconductor chip. Thus only the relatively small base current must be distributed whereby only a low distribution voltage drop results from small conductors.

In the inverting circuit 30', the transistors 244 and 246 inject base current into the current source transistor 240 which compensates for the base currents injected by each of the logic levels in each of the working logic circuits on the semiconductor chip. The resistor 242 has the same nominal value as the logic current source resistor but requires closer tolerance in selecting the value. The resistor 247 is half the logic load resistance therefore the voltage across the resistor 247 matches the output of the reference circuit 12 when conducting current equal to that in the typical logic load resistor. The voltage gain of the inverting circuit 30 is approximately the ratio of the resistor 247 to the resistor 242 or 0.5.

The current-source reference circuitry described generates a reference voltage, $V_{RS}$, establishing the optimum signal swing for the logical circuitry. This current is the largest which can be accomodated without allowing any logical transistor to conduct excessively in its base-collector path circuit, which condition would undesirably slow the circuit current switching speed and cause excessive noise in the other reference voltages. The two-level current switch logic requires an accurate upper level switching reference coordinated with the current source reference. Referring again to FIG. 1, the switch 22 is now closed thereby bypassing the inverter circuit 30. With the exceptions to be noted, the circuit is very much the same and operates very much the same as previously described in detail. The reference circuit 12 provides a reference voltage at an impedance of approximately 1,000 ohms for application to the erect input transistor 134 of the differential amplifying circuit 10 on FIG. 2A. Since the two input voltages to the differential amplifying circuit approximately match, dependent on transistor and current matching within the amplifying circuit, the inverted input of the amplifier 10 at transistor 136 tracks the reference voltage at the erect input. The output of the amplifying circuit 20 is applied to the base electrode of the transistor 136 through a resistor 165 in this case whereby this negative feedback action clamps the output regulated voltage $V_{RU}$ which tracks the original reference voltage applied through a resistor 133 to the erect input base of the transistor 134. Again the evener differential amplifier circuit 14 is arranged to improve the tracking tolerance of ±30 millivolts to about ±7 millivolts which is close to the limit established by process device tolerances.

Referring now to FIG. 2B, the reference generator 12 here is a logical emitter follower circuit designed to shift the input to the amplifying circuit 10 to one emitter follower drop below the upper level $V_{RU}$. The transistors 82 and 84 and the resistor 86 comprise a typical logical emitter follower circuit. The current is controlled by the application of regulated source voltage $V_{RS}$. The amplifier 100 is substantially identical to the amplifier 10 in the other reference voltage generating circuits. However, the input level is one $V_{BE}$ lower so that the emitter electrode voltage is about 0.8 volt lower and therefore less current flows in the transistors 102 and 104 which reduces the effective transconductance somewhat and reduces the voltage gain to about 10.

Referring to FIG. 2A the input reference circuit is merely a resistance element voltage divider; the ratio of the resistors 131/(131+132) determines the equivalent generator offset voltage. The equivalent impedance is chosen so that the base current drawn by amplifying circuit 10 cause a voltage drop about equal to that of one logical circuit load (or 0.270 ma/$\beta$) through a logical output resistor of approximately 2,000 ohms. This voltage drop causes the $V_{RU}$ voltage to track the $V_{RS}$ voltage which permits the logical circuit voltage swing to increase with decreasing beta approximately by the factor $(1+1/\beta)$. Thus a slightly larger voltage swing is available without saturation at lower beta. This is permissible because each logical circuit has at least one load which subtracts from the positive signal level that might otherwise saturate the driven circuit.

By taking advantage of this reference loading effect, the differential amplifiers 10 need not be restricted to low current operation. This simplifies the design of the circuitry and permits the use of differential amplifiers with but two transistors whereas otherwise compound transistor circuitry would be necessary. This permits the best possible offset voltage between the two amplifier inputs. For example, using two emitter-follower stages (commonly called a Darlington pair) per input would minimize loading the reference; however, then two base emitter junctions would exist between the two inputs and the common emitter junction. The offset of the operational amplifier would be about 10 millivolts; or twice that resulting from $V_{BE}$ matching in the design herein described.

The amplifying circuit 10 is a differentially connected common-emitter pair. The transistors 134 and 136 have large emitters and are identical in design. The amplifier circuit 14 has a total current-source current of about 0.5 milliampere. This current divides depending on the value of the energizing potential indicated by the double positive (++) symbol. This voltage is anywhere from 7.65 to 9.35 volts. The ratio varies in $\frac{1}{4}$ to $\frac{3}{4}$ of the total current flow through the resistor 156. The differential input voltage required for this range of operation is less than ±0.034 volts. This is also the differential voltage across the resistors 142 and 144 of the amplifying circuit 10. The voltage across each of resistors 142 and 144 is $\frac{1}{2}$ the voltage across the resistor 138 or approximately 1.0 volt. The current ratio in the resistors 142 and 144 therefore ranges about 1±0.034. The base current difference between the transistors 148 and 154 is no more than $\pm\frac{1}{2}\times 0.5$ milliampere/$\beta$ or ±0.006 milliampere. The current source in the amplifier 14 comprises a diode 151 and a resistor 152. The base of the transistor 154 is approximately twice the $V_{BE}$ above the upper regulating voltage $V_{RU}$. The emitter electrode of the diode 151 is about twice the $V_{BE}$ drop below the base of the transistor 154 and therefore about equal to the upper limit voltage $V_{RU}$. This is also the voltage across the resistor 152. Therefore the resistor current, which is equal to the total emitter current in the transistors 148 and 154, is nearly constant because most of the $V_{BE}$ variations with process and operating temperature will cancel. The capacitor 150 prevents oscillation in the amplifier 14 by reducing the magnitude of the negative feedback voltage gain to below 1 at 180 degrees phase shift.

An advantageous feature of the overall circuit arrangement shown in FIGS. 2A, 2B and 2C interconnect is the control of the output transistor 70 (FIG. 2B) by varying the current at a test point TP shown in FIG. 2A. A silicon chip and circuitry of which typically many devices such as this are a part, is often part of a much larger circuit not on the chip which is connected to the output terminals 76. For testing the larger circuit it is often desirable to cause all devices used, such as this one, to turn off. None of the output transistors 70 should be conducting. This is readily accomplished for all such devices on one chip by causing the reference voltage at the terminal 47 (FIG. 2B) to decrease by the amount of the logical signal swing as more fully described in the hereinbefore mentioned copending U.S. patent application Ser. No. 921,142.

Since the control for doing this is the voltage at the terminal 47 which is common to all driver circuits on the chip, all such devices will be turned off. The control of the voltage at the terminal 47 is accomplished by controlling the reference input voltage at the test point TP (FIG. 2A) merely by shunting a test resistor TR across the resistor 132. A resistance of 4 Kohm will change the voltage by 0.6 volts for ultimately turning of all of the drivers 70.

While the invention has been described in terms of preferred embodiments, and changes and variations have been suggested, it should be clearly understood that those skilled in the art will make further changes in their applications without departing from the spirit and scope of the invention as defined in the appended claims concluding the specification.

The invention claimed is:

1. Logical circuit reference electric energy level generating circuitry comprising a differential amplifying circuit having one input terminal to which a primary reference potential is applied, having another input terminal and a pair of output terminals, current flow evening circuitry including a differential amplifier having a pair of input terminals individually connected to said pair of output terminals of said differential amplifying circuit and having an output terminal to which electric energy dividing elements are connected in common and which are individually connected to said pair of input terminals of said differential amplifier circuit, repeating circuitry having an input terminal connected to one of said output terminals of said differential amplifying circuit and having an output terminal at which said electric energy level is delivered, and a feedback lead connected between said output terminal of said repeating circuitry and said other input terminal of said differential amplifying circuit.

2. Logical circuit reference electric energy level generating as defined in claim 1 and incorporating an inverting amplifier circuit interposed in said feedback lead.

3. Logical circuit reference electric potential generating circuitry comprising a differential amplifying circuit having two transistors, each having emitter, base and collector electrodes, circuitry establishing a primary reference potential connected to the base electrode of one of said transistors, a resistor connected between both of said emitter electrodes and a point of fixed reference potential, an evening differential amplifier circuit having two other transistors, each having emitter, base and collector electrodes a resistor connected between both of the emitter electrodes of said other transistors and said point of fixed reference potential, circuitry connecting the collector electrodes of said other transistors to a point of fixed energizing potential an electric level translating circuit connected to the collector of one of the two transistors of the differential amplifying circuit, and having one coupling transistor including emitter, base and collector electrodes and at least one output transistor having emitter, base and collector electrodes, a resistor connecting the collector electrode of said one coupling transistor to said point of fixed energizing potential, an electric feedback connection between the emitter electrode of said one output transistor and the base electrode of the other transistor of said differential amplifying circuit, and output terminals individually connected to said emitter electrode of said one output transistor and to said point of fixed reference potential between which load circuitry is connected.

4. Logical circuit reference electric potential generating circuitry as defined in claim 3 and incorporating an inverting circuit interposed in said electric feedback connection.

5. Logical circuit reference electric potential generating circuitry as defined in claim 4 and wherein said inverting circuit comprises a plurality of transistors having the emitter-collector circuits connected in series between a load resistor and a bias resistor all connected between said point of energizing potential and said point of fixed reference potential.

6. Logical circuit reference electric potential generating circuitry as defined in claim 3 and incorporating a diode interposed in the emitter-to-reference potential connections of said evening differential amplifier circuit.

7. Logical circuit reference electric potential generating circuitry as defined in claim 3 and incorporating a transistor having the collector-emitter circuitry interposed in the emitter-to-reference potential connections of said evening differential amplifier circuit and having the base electrode connected to said reference voltage output emitter follower transistor.

8. Logical circuit reference electric potential generating circuitry as defined in claim 3 and incorporating a transistor having the collector-emitter circuit interposed in the connection between said point of energizing potential and the collector electrodes of both of said transistors in said differential amplifying circuit and having the base electrode connected to the output of said evening differntial amplifier circuit.

9. Logical circuit reference electric potential generating circuitry as defined in claim 8 and incorporating a diode interposed in the output connections of said evening differential amplifier circuit.

10. Logical circuit reference electric potential generating circuitry as defined in claim 3 and wherein said primary reference establishing circuitry comprises a pair of resistors connected in series across a source of energizing potential and having the junction therebetween connected to said base electrode of said one transistor.

11. Logical circuit reference electric potential generating circuitry as defined in claim 3 and wherein said primary reference establishing circuitry comprises at least the output circuitry of another logical circuit reference voltage generating circuit.

12. Logical circuit reference electric potential generating circuitry as defined in claim 11 and incorporating a simulated logical circuit interposed in said base electrode connections.

13. Logical circuit reference electric potential generating circuitry as defined in claim 3 and incorporating a multiple of other output transistors substantially connected in parallel to said one output transistor, and an electric conductor grid arranged in the feedback loop of said differential amplifying circuit connected to the emitter electrodes of said output transistors and routed among a multiple of utilization circuits for distributing said reference potential with negligible potential drop.

14. Logical circuit reference electric potential generating circuitry as defined in claim 3 and wherein the base current drawn by the transistors in said differential amplifying circuit is confined to a range wherein the voltage drop across a logical output resistor is of the order of one logical circuit load, and thereby the voltage swing is increased.

* * * * *